US012603492B2

(12) United States Patent (10) Patent No.: US 12,603,492 B2

Jeon et al. (45) Date of Patent: Apr. 14, 2026

(54) PROTECTION CIRCUIT MODULE AND BATTERY PACK INCLUDING THE SAME

(71) Applicant: SAMSUNG SDI CO., LTD., Yongin-si (KR)

(72) Inventors: Peel Sik Jeon, Suwon-si (KR); Un Sic Lee, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 51 days.

(21) Appl. No.: 18/417,218

(22) Filed: Jan. 19, 2024

(65) Prior Publication Data

US 2025/0141212 A1    May 1, 2025

(30) Foreign Application Priority Data

Oct. 25, 2023    (KR) ........................ 10-2023-0143778

(51) Int. Cl.
   *H02H 7/18* (2006.01)
   *H05K 1/18* (2006.01)
   *H05K 1/181* (2026.01)
(52) U.S. Cl.
   CPC .............. *H02H 7/18* (2013.01); *H05K 1/181* (2013.01); *H05K 2201/10037* (2013.01); *H05K 2201/10181* (2013.01)
(58) Field of Classification Search
   CPC .......... H05K 2201/10037; H05K 2201/10181; H05K 2201/09481; H05K 2201/10545; H05K 1/181; H05K 1/0218; H05K 1/0259; H05K 1/117; H05K 1/0257;

H01M 2200/103; H01M 10/48; H01M 10/425; H01M 50/284; H01M 50/583; H01M 50/574; H02H 7/18; H02H 3/08; H02H 7/20; H02H 9/046; H02H 9/044; Y02E 60/10; H02J 7/00308

See application file for complete search history.

(56) References Cited

U.S. PATENT DOCUMENTS

| | | | | | |
|---|---|---|---|---|---|
| 10,021,784 | B1 * | 7/2018 | Lee | ........................... | H05K 1/09 |
| 2006/0046537 | A1 * | 3/2006 | Chong | ................. | H01R 12/526 |
| | | | | | 439/79 |
| 2022/0094109 | A1 * | 3/2022 | Ko | ......................... | H01R 13/665 |
| 2022/0210916 | A1 * | 6/2022 | Shueh | ..................... | H05K 1/116 |
| 2024/0079749 | A1 * | 3/2024 | Kawai | .................... | H01M 10/48 |

FOREIGN PATENT DOCUMENTS

| | | | | | |
|---|---|---|---|---|---|
| EP | | 2955848 | A1 * | 12/2015 | ........... H05K 1/0263 |
| WO | WO 2022/164378 | A1 | | 8/2022 | |

OTHER PUBLICATIONS

Extended European Search Report issued in corresponding EP Patent Application No. 24160413.1, dated Aug. 7, 2024, 9 pages.

* cited by examiner

*Primary Examiner* — Elim Ortiz

(74) *Attorney, Agent, or Firm* — Womble Bond Dickinson (US) LLP

(57) ABSTRACT

A protection circuit arrangement includes a substrate having a first surface and a second surface; a connector on the first surface and electrically connected to a battery cell; an overvoltage protection element on the second surface and electrically connected to the connector; and a fuse on the first surface and electrically connected to the overvoltage protection element.

13 Claims, 7 Drawing Sheets

FIG. 1

PROTECTION CIRCUIT MODULE AND BATTERY PACK INCLUDING THE SAME

CROSS-REFERENCE TO RELATED APPLICATION

The present application claims priority to and the benefit of Korean Patent Application No. 10-2023-0143778, filed on Oct. 25, 2023, in the Korean Intellectual Property Office, the entire disclosure of which is incorporated herein by reference.

BACKGROUND

1. Field

Aspects of embodiments of the present disclosure relate to a protection circuit arrangement and a battery pack including the same.

2. Description of the Related Art

A battery pack typically includes a plurality of battery cells connected in series. It is necessary to periodically monitor current, voltage, temperature, and the like of each of the plurality of battery cells constituting the battery pack in order to ensure that the battery pack is functioning properly. To monitor each of the plurality of battery cells, the battery pack is provided with sensing lines. These sensing lines are connected to a protection circuit module through connectors.

The protection circuit module may be connected to the sensing lines to protect ICs monitoring each of the plurality of battery cells from hazards, such as overvoltage, overcurrent, and the like. The protection circuit module may include a number of passive elements, such as overvoltage protection elements, fuses, and resistors, to increase robustness against electrostatic discharge (ESD).

On the other hand, as a number of passive elements are arranged on a board of the protection circuit module, a distance between the connector and the overvoltage protection element increases. The increased distance between the connector and the overvoltage protection element can cause degradation in performance of the protection circuit module.

This section is intended only to provide a better understanding of the background of the invention and thus may include information which is not necessarily prior art.

SUMMARY

Aspects of embodiments of the present disclosure are directed to a protection circuit arrangement (e.g., a protection circuit module or protection circuit) that enables effective protection of a battery management device (such as an analog front end integrated circuit, AFE IC) from electrostatic discharge, and a battery pack including the same.

The above and other aspects and features of the present invention will become apparent from the following description of embodiments of the present invention.

According to some embodiments of the present disclosure, there is provided a protection circuit arrangement including: a substrate having a first surface and a second surface; a connector on the first surface and electrically connected to a battery cell; an overvoltage protection element on the second surface and electrically connected to the connector; and a fuse on the first surface and electrically connected to the overvoltage protection element.

In some embodiments, the substrate includes: a first conductive via and a second conductive via extending through the first surface and the second surface; a first conductive line on the second surface and electrically connected to the first and second conductive vias; and a second conductive line on the first surface and electrically connected to the second conductive via.

In some embodiments, the connector is electrically connected to the first conductive via.

In some embodiments, the overvoltage protection element is electrically connected to the first conductive line.

In some embodiments, the substrate further includes a ground region on the second surface, and the overvoltage protection element is electrically connected to the ground region.

In some embodiments, the fuse is electrically connected to the second conductive line.

In some embodiments, the protection circuit arrangement further includes: an analog front end integrated circuit (AFE IC) on the first surface and electrically connected to the fuse.

In some embodiments, the overvoltage protection element includes a transient voltage suppressor (TVS).

According to some embodiments of the present disclosure, there is provided a battery pack including: a battery cell; an analog front end integrated circuit (AFE IC); and a protection circuit arrangement configured to electrically connect the battery cell to the AFE IC and to protect the AFE IC from electrostatic discharge, the protection circuit arrangement includes: a substrate having a first surface and a second surface; a connector on the first surface and electrically connected to a battery cell; an overvoltage protection element on the second surface and electrically connected to the connector; and a fuse on the first surface and electrically connected to the overvoltage protection element.

In some embodiments, the substrate includes: a first conductive via and a second conductive via extending through the first surface and the second surface; a first conductive line on the second surface and electrically connected to the first and second conductive vias; and a second conductive line on the first surface and electrically connected to the second conductive via.

In some embodiments, the connector is electrically connected to the first conductive via.

In some embodiments, the overvoltage protection element is electrically connected to the first conductive line.

In some embodiments, the substrate further includes a ground region on the second surface, and the overvoltage protection element is electrically connected to the ground region.

In some embodiments, the fuse is electrically connected to the second conductive line.

In some embodiments, the overvoltage protection element includes a transient voltage suppressor (TVS).

According to some embodiments of the present disclosure, a protection circuit arrangement (e.g., a protection circuit module or protection circuit) has a circuit configuration with components being sequentially connected in the order of the connector, the fuse, and the overvoltage protection element to reduce an inductance component of the protection circuit arrangement, thereby achieving an improvement in overvoltage protection performance of the protection circuit arrangement.

However, aspects and features of the present invention are not limited to the above and other aspects and features not mentioned will be clearly understood by those skilled in the art from the detailed description given below.

BRIEF DESCRIPTION OF THE DRAWINGS

The following drawings attached to this specification illustrate embodiments of the present invention, and further describe aspects and features of the present invention together with the detailed description of the present invention. Thus, the present invention should not be construed as being limited to the drawings:

FIG. 1 is a side view of a protection circuit arrangement according to some embodiments of the present invention;

DETAILED DESCRIPTION

Figure 2:
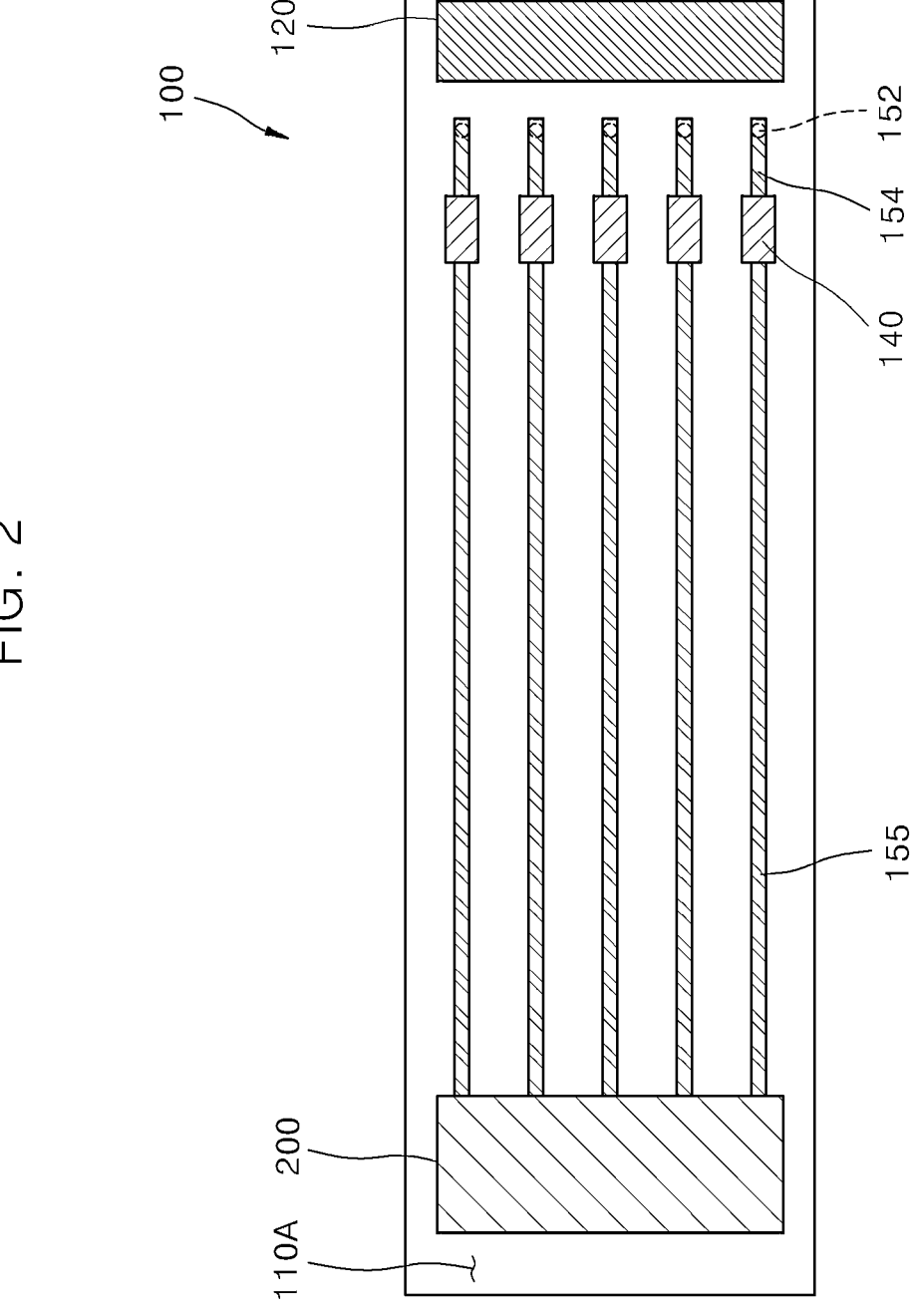
FIG. 2 is a top view of the protection circuit arrangement according to some embodiments of the present invention.

Hereinafter, exemplary embodiments of the present invention will be described, in detail, with reference to the accompanying drawings. The terms or words used in this specification and claims should not be construed as being limited to the usual or dictionary meaning and should be interpreted as having meanings and concepts consistent with the technical idea of the present invention based on the principle that the inventor can be his/her own lexicographer to appropriately define the concept of the term to explain his/her invention in the best way. The embodiments described in this specification and the configurations shown in the drawings are only some of the embodiments of the present invention and may not represent all of the technical ideas, aspects, and features of the present invention. Accordingly, it should be understood that there may be various equivalents and modifications that can replace or modify the embodiments described herein at the time of filing this application. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof. Further, the use of "may" when describing embodiments of the present invention relates to "one or more embodiments of the present invention."

In the figures, dimensions of the various elements, layers, etc. may be exaggerated for clarity of illustration. The same reference numerals designate the same elements.

References to two compared elements, features, etc. as being "the same," may mean that they are "substantially the same." The phrase "substantially the same" may include a case having a deviation that is considered low in the art, for example, a deviation of 5% or less. In addition, when a certain parameter is referred to as being uniform in a given region, it may mean that it is uniform in terms of an average.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Throughout the specification, unless otherwise stated, each element may be singular or plural.

When an arbitrary element is referred to as being disposed (or located or positioned) "above" (or "below") or "on" (or "under") a component, it may mean that the arbitrary element is placed in contact with the upper (or lower) surface of the component and may also mean that another component may be interposed between the component and any arbitrary element disposed (or located or positioned) on (or under) the component.

In addition, it will be understood that, when an element is referred to as being "coupled," "linked" or "connected" to another element, the elements may be directly "coupled," "linked" or "connected" to each other, or an intervening element may be present therebetween, through which the element may be "coupled," "linked" or "connected" to another element. In addition, when a part is referred to as being "electrically coupled" to another part, the part can be directly connected to another part or an intervening part may be present therebetween such that the part and another part are indirectly connected to each other.

As used herein, the term "and/or" includes any and all combinations of one or more of the associated listed items. For example, the expression "A and/or B" denotes A, B, or A and B. Expressions such as "one or more of" and "at least one of," when preceding a list of elements, modify the entire list of elements and do not modify the individual elements of the list. For example, the expression "one or more of A, B, and C," "at least one of A, B, or C," "at least one of A, B, and C," and "at least one selected from the group consisting of A, B, and C" indicates only A, only B, only C, both A and B, both A and C, both B and C, or all of A, B, and C.

When "C to D" is stated, it means C or more and D or less, unless otherwise specified.

Figure 1:
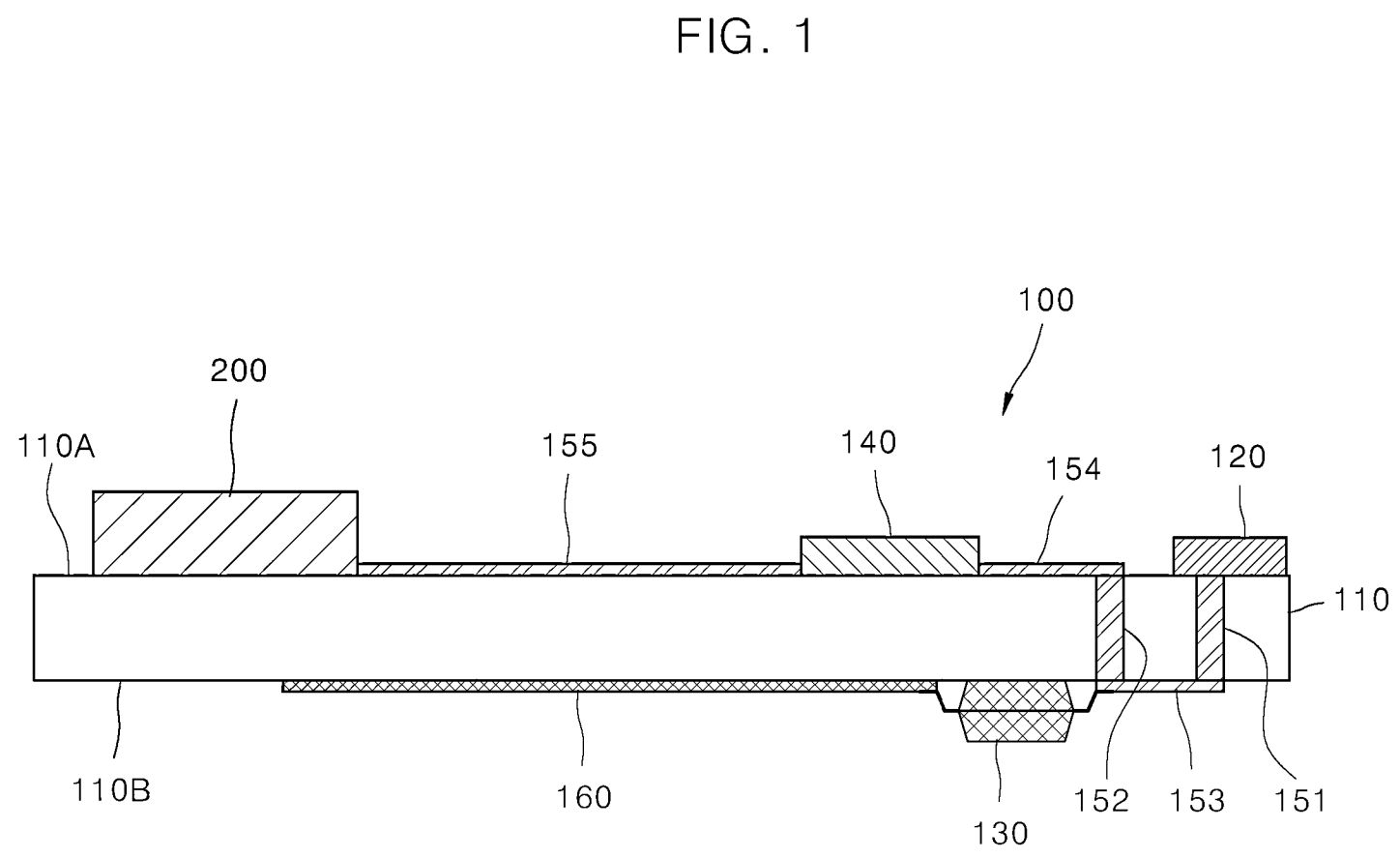
Figure 3:
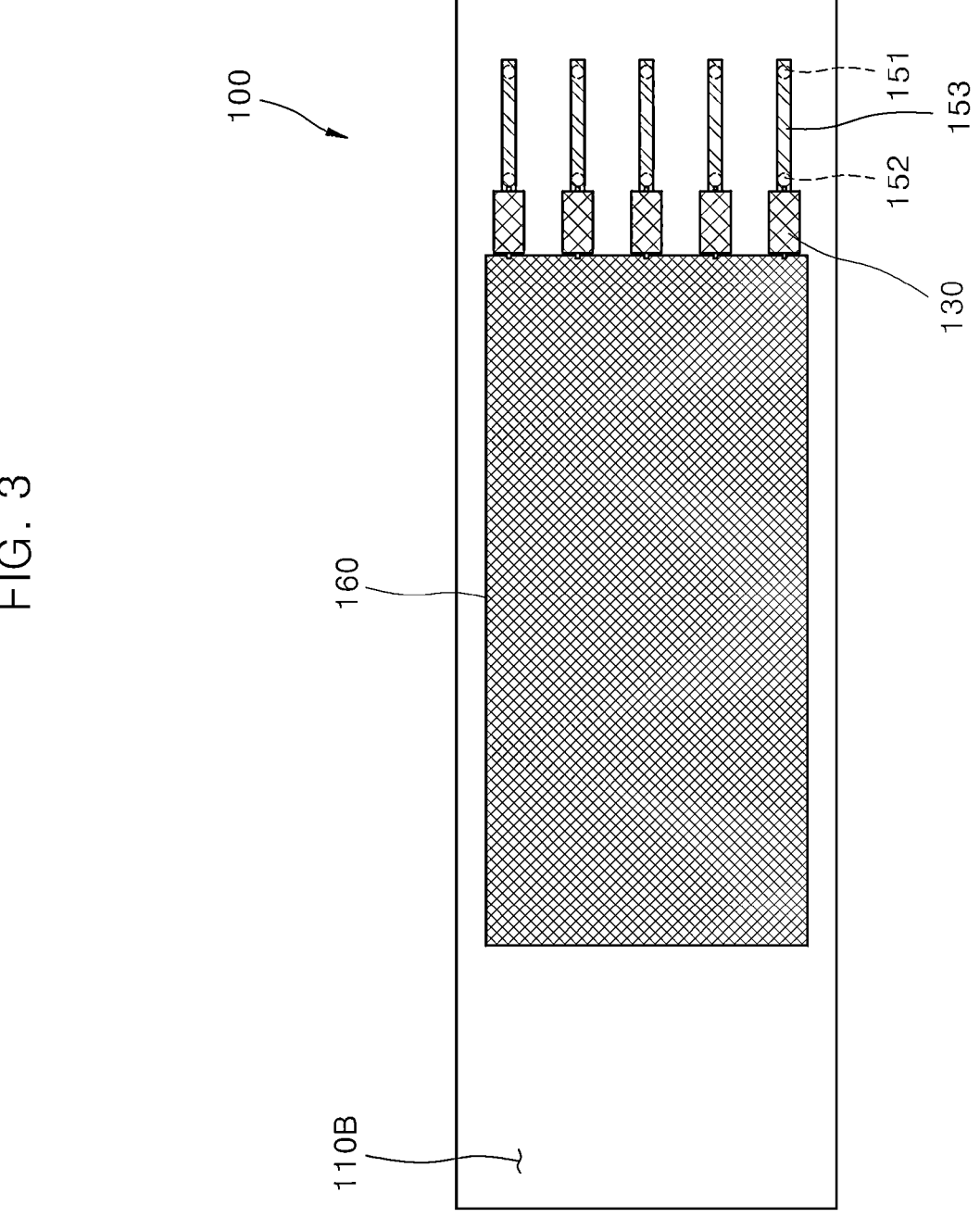
FIG. 3 is a bottom view of the protection circuit arrangement according to some embodiments of the present invention.

Referring to FIG. 1 to FIG. 3, a protection circuit arrangement (e.g., a protection circuit module or protection circuit) 100 according to some embodiments of the present invention includes a substrate 110, a connector 120, at least one overvoltage protection element 130, and at least one fuse 140. The protection circuit arrangement 100 may include as many overvoltage protection elements 130 and fuses 140 as battery cells connected to the connector 120. For example, assuming that the number of battery cells connected to the connector 120 is five, the protection circuit arrangement 100 may include five overvoltage protection elements 130 and five fuses 140.

The substrate 110 may have at least one electronic component mounted thereon. According to some embodiments, the substrate 110 may be a hard printed circuit board or a flexible printed circuit board. According to some embodiments, the substrate 110 may be a double-sided printed circuit board or a multilayer printed circuit board.

The substrate 110 may include a plurality of layers. The plurality of layers may include a first outer layer formed on a first surface 110A of the substrate 110, and a second outer layer formed on a second surface 110B of the substrate 110 opposite the first surface 110A of the substrate 110. The first surface 110A may be an upper surface of the substrate 110. The second surface 110B may be a lower side of the substrate 110. The plurality of layers may include at least one inner layer disposed between the first outer layer and the second outer layer.

The substrate 110 may include at least one insulating layer. The insulating layer may be disposed between layers having conductive regions formed therein to prevent or substantially reduce interlayer current from flowing in regions other than the conductive vias. The insulating layer may be formed of an insulating material.

The substrate 110 may include a conductive region 150. The conductive region 150 may be disposed in at least one of the plurality of layers included in the substrate 110. The conductive region 150 may be disposed in at least one of the first outer layer, the second outer layer, and the inner layer. The conductive regions 150 may electrically connect the electronic components mounted on the substrate 110 to each other. The conductive region 150 may electrically connect at least one electronic component mounted on the substrate 110 to external electronic components.

According to some embodiments, the conductive region 150 is formed of copper, aluminum, silver, tin, gold, nickel, lead, titanium, or an alloy thereof. However, it should be understood that the material for the conductive region 150 is not limited thereto and the conductive region 150 may be formed of a variety of suitable conductive materials.

According to some embodiments, the conductive region 150 includes at least one first conductive via 151, at least one second conductive via 152, at least one first conductive line 153, at least one second conductive line 154, and at least one third conductive line 155. The substrate 110 may include as many first conductive vias 151, second conductive vias 152, first conductive lines 153, second conductive lines 154, and third conductive lines 155 as the battery cells connected to the connector 120. For example, assuming that the number of battery cells connected to the connector 120 is five, the substrate 110 may include five of each of the first conductive via 151, the second conductive via 152, the first conductive line 153, the second conductive line 154, and the third conductive line 155.

The first conductive via 151 may be formed to extend through the first surface 110A and the second surface 110B of the substrate 110. The first conductive via 151 may be formed in a region under or around the region where the connector 120 is disposed. The first conductive via 151 may be connected to the connector 120.

The second conductive via 152 may be formed to extend through the first surface 110A and the second surface 110B of the substrate 110. The second conductive via 152 may be formed at a location spaced apart from the first conductive via 151 by a predetermined distance in a longitudinal direction of the substrate 110.

The first conductive line 153 may be disposed on the second surface 110B of the substrate 110. The first conductive line 153 may be disposed on the second outer layer of the substrate 110. The first conductive line 153 may also be disposed on the inner layer of the substrate 110. The first conductive line 153 may be connected at one end thereof to the first conductive via 151 and at the other end thereof to the second conductive via 152. The first conductive line 153 may be connected to the overvoltage protection element 130.

The second conductive line 154 may be disposed on the first surface 110A of the substrate 110. The second conductive line 154 may be disposed on the first outer layer of the substrate 110. The second conductive line 154 may also be disposed on the inner layer of the substrate 110. The second conductive line 154 may be connected at one end thereof to the second conductive via 152 and at the other end thereof to the fuse 140.

The third conductive line 155 may be disposed on the first surface 110A of the substrate 110. The third conductive line 155 may be disposed on the first outer layer of the substrate 110. The third conductive line 155 may also be disposed on the inner layer of the substrate 110. The third conductive line 155 may be connected at one end thereof to the fuse 140 and at the other end thereof to an analog front end integrated circuit (AFE IC) 200. The AFE IC 200 may detect at least one of temperature, voltage, and current of each of the battery cells connected to the connector 120, and may output a detection result to an external device (for example, a controller of a battery management device).

The substrate 110 may include a ground region (ground) 160. The ground region 160 may be disposed on the second surface 110B of the substrate 110. The ground region 160 may be disposed on the second outer layer of the substrate 110. The ground region 160 may also be disposed on the inner layer of the substrate 110. According to some embodiments, the ground region 160 is formed at a location spaced apart from the first conductive line by a set or predetermined distance in the longitudinal direction of the substrate 110.

The connector 120 may be disposed on the first surface 110A of the substrate 110. The connector 120 may be disposed on the first outer layer. The connector 120 may be a device for connecting at least one battery cell to the AFE IC 200. The connector 120 may electrically connect at least one battery cell to the AFE IC 200. The connector 120 may include at least one terminal configured to be connected to the battery cell. The terminal may be connected to the battery cell via a wire or a bus. The connector 120 may include a terminal configured to be connected to a B+ high current line and a terminal configured to be connected to a B− high current line. The connector 120 may be connected to the first conductive via 151.

The overvoltage protection element 130 may be disposed on the second surface 110B. The overvoltage protection element 130 may be disposed on the second outer layer. According to some embodiments, the overvoltage protection element 130 includes a transient voltage suppressor (TVS) diode. However, it should be understood that the overvoltage protection element 130 is not limited thereto and various suitable devices capable of limiting voltage applied to the connector 120 may be employed as the overvoltage protection element 130.

The overvoltage protection element 130 may be conducted when a voltage of a preset magnitude or more is applied. Depending on conduction of the overvoltage protection element 130, part of the voltage applied to the connector 120 may be absorbed by the overvoltage protection element 130, thereby preventing excessive voltage from being applied to the AFE IC 200 or substantially reducing incidents thereof. The overvoltage protection element 130 may be connected at one end thereof to the first conductive line 153 and at the other end thereof to the ground region 160.

The fuse 140 may be disposed on the first surface 110A. The fuse 140 may be disposed on the first outer layer. When a current exceeding a threshold (e.g., a preset threshold) is applied thereto (i.e., upon occurrence of overcurrent), the fuse 140 may be melted and disconnected to protect the AFE IC 200 from the overcurrent. The fuse 140 may be connected at one end thereof to the second conductive line 154 and connected at the other end thereof to the third conductive line 155.

Figure 4:
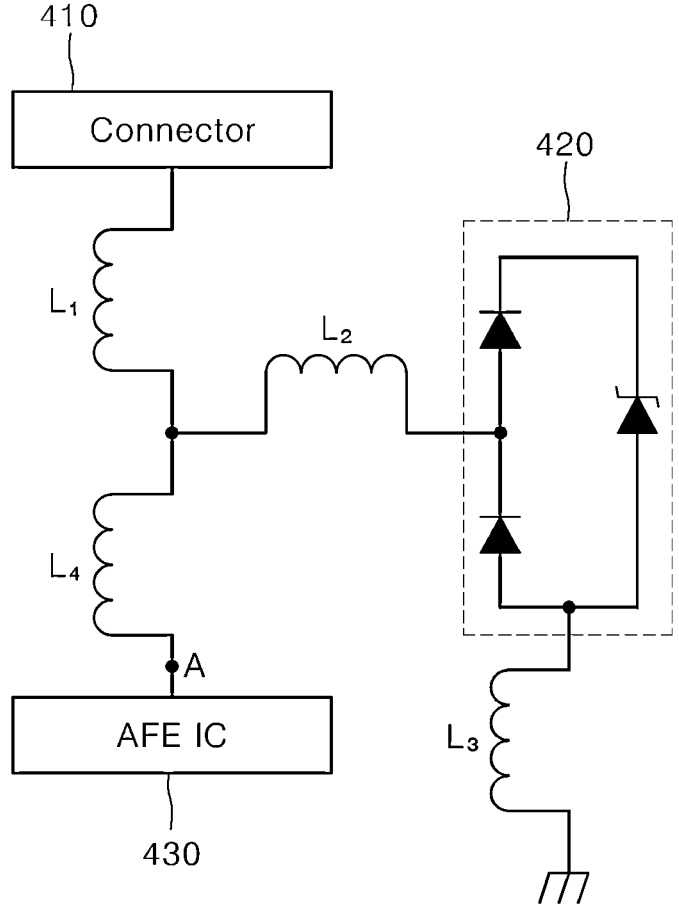
FIG. 4 is a circuit diagram including an overvoltage protection element according to some embodiments of the present invention.

FIG. 4 is a circuit diagram including an overvoltage protection element according to some embodiments of the present invention.

Referring to FIG. 4, in a circuit in which an overvoltage protection element 420 is connected between a connector 410 and an AFE IC 430, if a voltage due to electrostatic discharge (ESD) is applied to the connector 410, the voltage (voltage at node A) applied to the AFE IC 430 may be defined by Equation 1:

$$V_{ESD} = V_{BR\_TVS} + R_{DYN\_TVE} I_{ESD} + L\left(\frac{dI_{ESD}}{dt}\right).$$

Here, $V_{ESD}$ is the voltage (e.g., voltage at node A) applied to the AFE IC 430 due to electrostatic discharge, $V_{BR\_TVS}$ is the breakdown voltage of the overvoltage protection element 420 (voltage at which the overvoltage protection element 420 starts to clamp), $R_{DYN\_TVS}$ is the internal resistance of the overvoltage protection element 420, $I_{ESD}$ is the current flowing in the overvoltage protection element 420, and L may mean inductance of the overall circuit.

It can be seen from Equation 1 that, when inductance components $L_1$ and $L_3$ of the protection circuit arrangement 400 increase, the voltage $V_{ESD}$ applied to the AFE IC 430 during electrostatic discharge increases. Thus, to reduce the voltage applied to the AFE IC 430 upon electrostatic discharge, it is desirable to reduce the inductance components $L_1$ and $L_3$ of the protection circuit arrangement 400.

Figure 5:
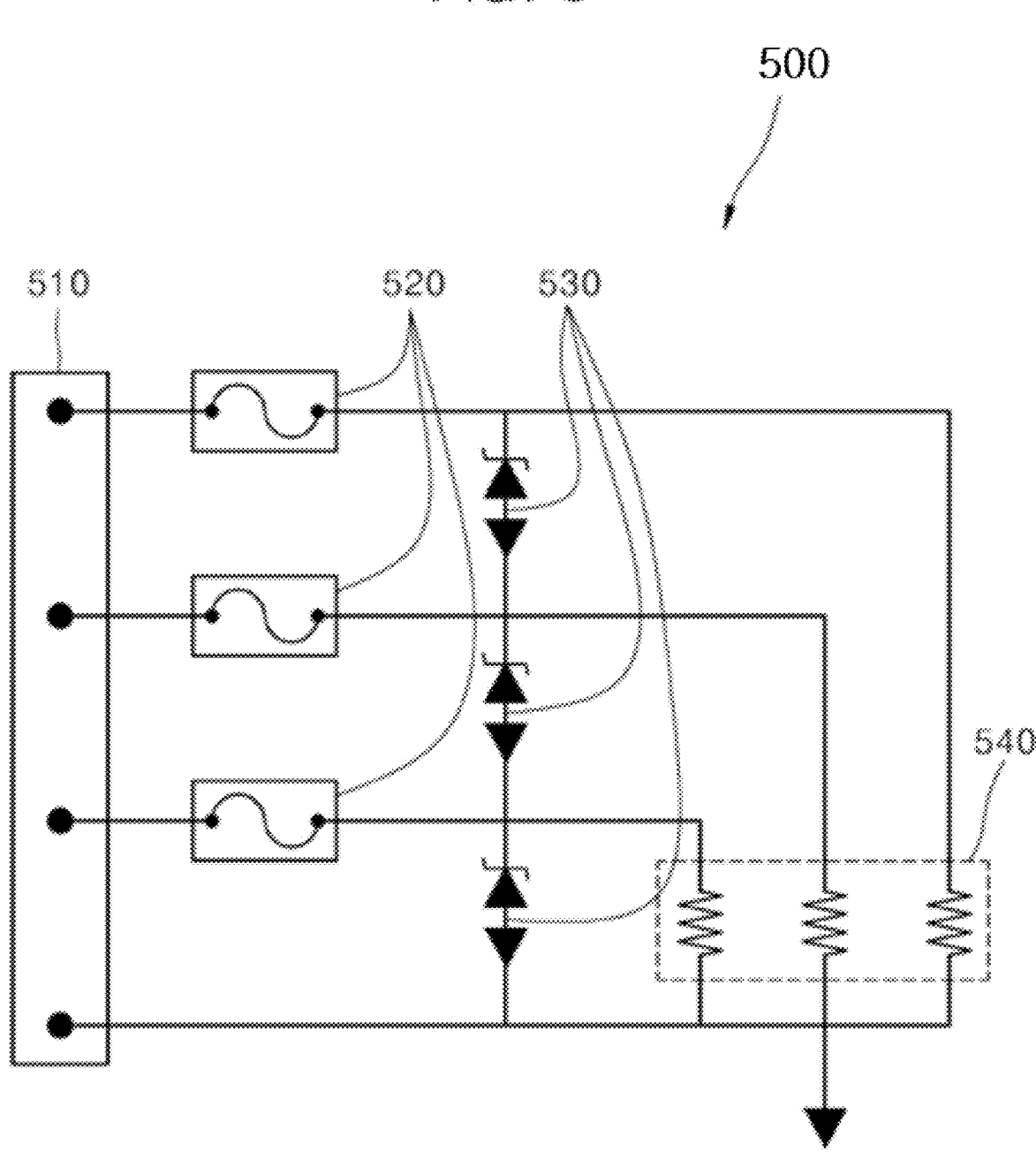
FIG. 5 is a circuit diagram of an example protection circuit arrangement of the related art.

FIG. 5 is a circuit diagram of an example protection circuit of the related art. Referring to FIG. 5, a protection circuit arrangement 500, in which a connector 510, a fuse 520, and an overvoltage protection element 530 are all disposed on the upper surface of the substrate, has a circuit configuration with components being sequentially connected in the order of the connector 510, the fuse 520, the overvoltage protection element 530, and the AFE IC 540. With the circuit configuration shown in FIG. 5, the protection circuit arrangement 500 has a significant distance between the connector 510 and the overvoltage protection element 530, causing increase in inductance component $L_1$ of the circuit. In addition, the protection circuit arrangement 500 having the circuit configuration shown in FIG. 5 requires a separate conductive via to connect the overvoltage protection element 530 disposed on the upper surface of the substrate to the ground region disposed on the lower surface of the substrate, thereby increasing the inductance component $L_3$ of the circuit.

TABLE 1

|  | Application of first channel ESD | Application of second channel ESD | Application of third channel ESD |
|---|---|---|---|
| First channel voltage | 2216 V | 1953 V | 2034 V |
| Second channel voltage | 2007 V | 2091 V | 2039 V |
| Third channel voltage | 2004 V | 1960 V | 2247 V |

Table 1 shows voltages measured at the AFE IC 540 when an electrostatic discharge voltage of 27 kV is applied to the protection circuit arrangement 500. From Table 1, it can be seen that, when an electrostatic discharge voltage of 27 kV is applied to three terminals included in the connector 510, a maximum of 2247 V is applied to the AFE IC 540 in the protection circuit arrangement 500.

Figure 6:
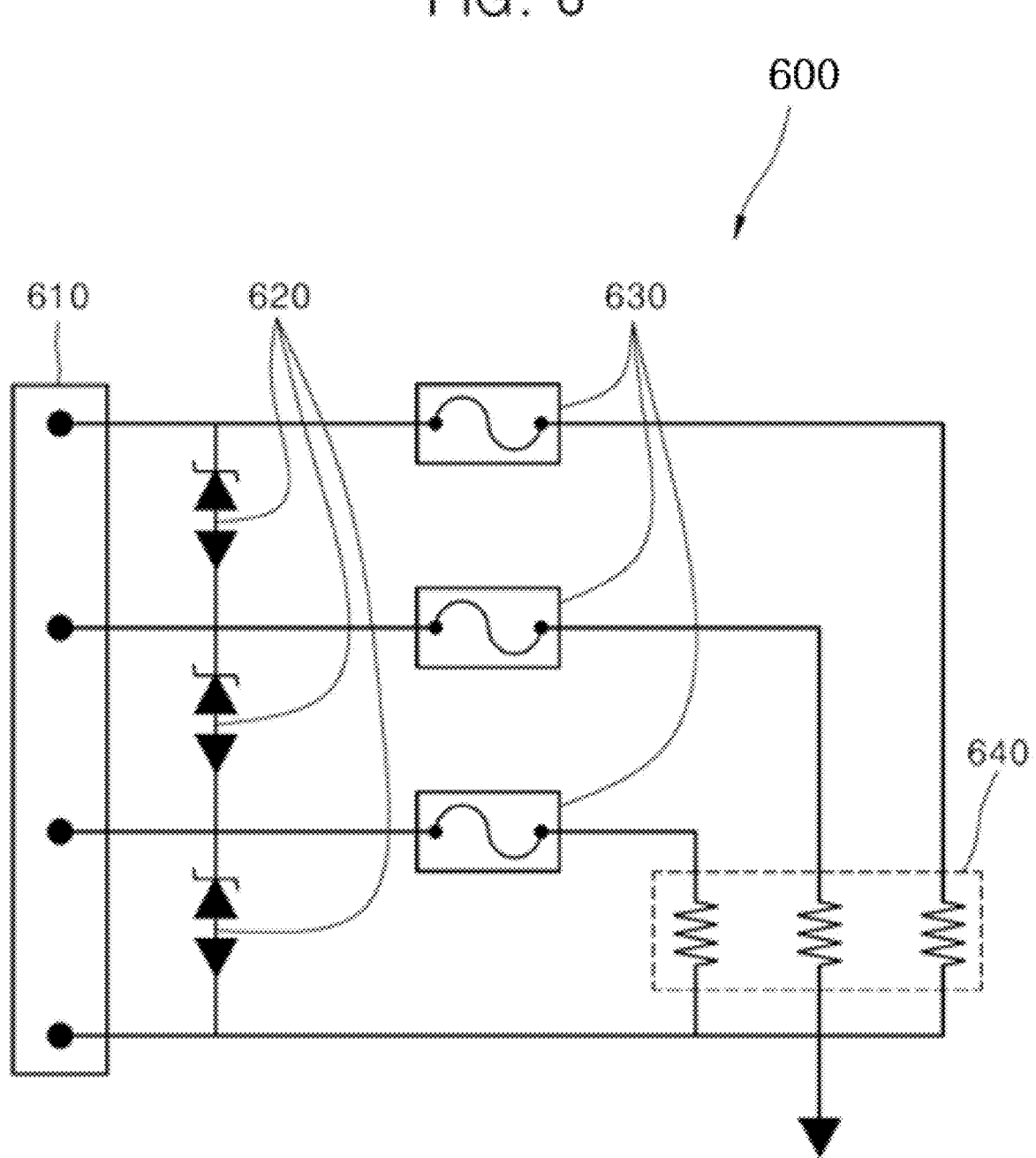
FIG. 6 is a circuit diagram of a protection circuit arrangement according to some embodiments of the present invention.

FIG. 6 is a circuit diagram of a protection circuit arrangement according to some embodiments of the present invention. A protection circuit arrangement 600, in which a connector 610 and a fuse 630 are disposed on the upper surface of the substrate and an overvoltage protection element 620 is disposed on the lower surface of the substrate, has a circuit configuration with components being sequentially connected in the order of the connector 610, the overvoltage protection element 620, the fuse 630, and the AFE IC 640, as shown in FIG. 6. The protection circuit arrangement 600 can reduce the distance between the connector 610 and the overvoltage protection element 620, thereby reducing the inductance component $L_1$ of the circuit, as compared to a circuit of the related art. Further, since both the overvoltage protection element 620 and the ground region are disposed on the lower surface of the substrate, the protection circuit arrangement 600 does not require a separate conductive via to connect the overvoltage protection element 620 to the ground region, whereby the inductance component $L_3$ of the circuit can be reduced. As such, by reducing the inductance component of the protection circuit arrangement 600, the protection circuit arrangement 600 can reduce the voltage applied to the AFE IC 640 in the event of electrostatic discharge.

TABLE 2

|  | Application of first channel ESD | Application of second channel ESD | Application of third channel ESD |
|---|---|---|---|
| First channel voltage | 1841 V | 1727 V | 1720 V |
| Second channel voltage | 1772 V | 1887 V | 1768 V |
| Third channel voltage | 1718 V | 1732 V | 1895 V |

Table 2 shows voltages measured at the AFE IC 640 when an electrostatic discharge voltage of 27 kV is applied to the protection circuit arrangement 600 according to some embodiment. From Table 2, it can be seen that, when an electrostatic discharge voltage of 27 kV is applied to the three terminals included in the connector 610, a maximum of 1895 V is applied to AFE IC 640 in the protection circuit arrangement 600.

Figure 7:
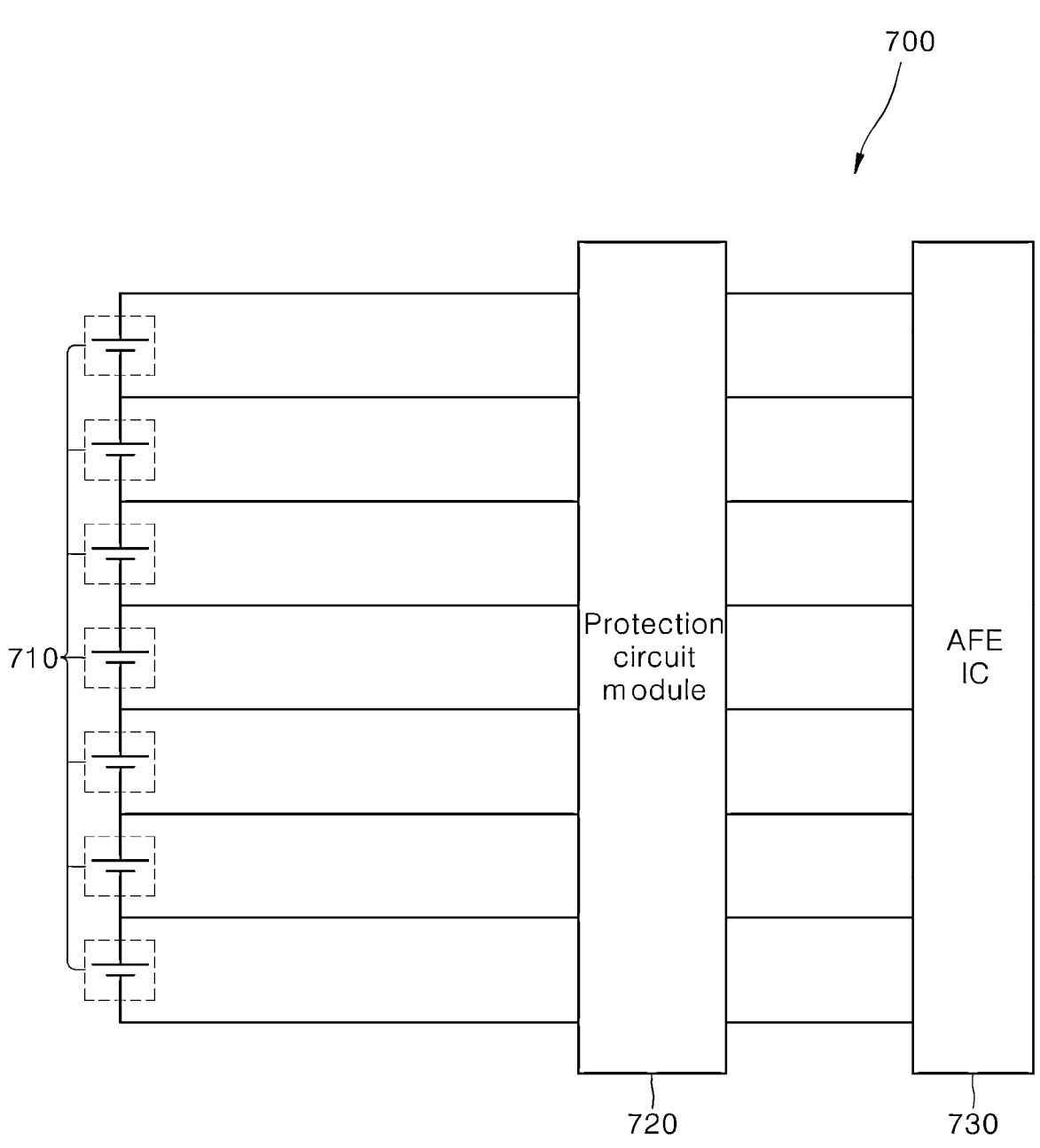
FIG. 7 is a block diagram of a battery pack according to some embodiments of the present invention.

FIG. 7 is a block diagram of a battery pack. Referring to FIG. 7, a battery pack 700 according to some embodiments of the present invention has a structure that can be electrically connected to an external device through a cathode connection terminal P(+) and an anode connection terminal P(−). When the external device is a load, the battery pack 700 is discharged by acting as a power source to provide power to the load. The external device operating as a load may be, for example, an electronic device, a mobile vehicle, or an energy storage system (ESS). Here, the mobile vehicle may be, for example, an electric vehicle, a hybrid vehicle, or a smart mobility device.

The battery pack 700 may include a plurality of battery cells 710, a protection circuit arrangement 720, and an AFE IC 730. However, the battery pack 700 may further include other components.

The plurality of battery cells 710 may be connected to each other in series, in parallel, or a combination of both (where a battery cell is in series with one or more cells and parallel to one or more cells) to constitute at least one battery module. The battery module may include a plurality of battery cells 710 and a module housing. The battery modules may be connected to each other in series, in parallel, or in a combination of both (where a battery module is in series with one or more modules and parallel to one or more battery modules).

The battery cells 710 may be stacked and received in the module housing. The battery cells 710 may include cathode leads and anode leads. The battery cells 710 may be round, prismatic, or pouch type battery cells depending on the shape of the battery.

The battery pack 700 may include a single stack of cells stacked to form a single module instead of the battery modules. The cell stack may be received in an accommodation space of the pack housing, or in an accommodation space partitioned by a frame, a partition wall, and/or the like.

The battery cell 710 may generate a large amount of heat during charging/discharging. The generated heat may be accumulated in the battery cell 710 to promote degradation of the battery cell 710, unless dissipated. Accordingly, the battery pack 700 may further include a cooling member to inhibit degradation of the battery cell 710. The cooling member may be disposed at a lower portion of the accommodation space which receives the battery cells 710. In some examples, the cooling member may be disposed at an upper portion or a side surface thereof depending on the battery pack.

Exhaust gas generated inside the battery cell 710 due to an abnormal operating condition, also known as thermal runaway or thermal events in the battery cell 710, may be discharged from the battery cell 710. The battery pack 700 or the battery module may include an exhaust vent or the like for discharging the exhaust gas to suppress damage to the battery pack 700 or module due to the exhaust gas.

The protection circuit arrangement 720 may be a device for protecting the AFE IC 730 from hazards, such as overvoltage, overcurrent, and/or the like. The protection circuit arrangement 720 may be electrically connected to the plurality of battery cells 710. The protection circuit arrangement 720 may be electrically connected to the AFE IC 730. The protection circuit arrangement 720 may be disposed in a path (e.g., a current path) connecting the plurality of battery cells 710 and the AFE IC 730.

The AFE IC 730 may detect at least one of temperature, voltage, and current for each of the battery cells 710 connected to the connector, and may output a detection result to an external source (for example, a battery management device). The AFE IC 730 may correspond to components constituting a battery management device. The AFE IC 730 may transmit information about the results of detecting at least one of temperature, voltage, and current of each of the battery cells 710 to other components of the battery management device (for example, a balancing device, a control device, etc.). The AFE IC 730 may be electrically connected to the protection circuit arrangement 720.

The battery pack 700 may include a battery and a battery management system (BMS) for managing the battery. The battery management device may include a detection device, a balancing device, and a control device.

The detection device may sense a state (e.g., voltage, current, temperature, etc.) of the battery and detect state information indicative of the state of the battery. The AFE IC 730 may correspond to the detection device. The detection device may detect a voltage of each cell or each battery module constituting the battery. The detection device may also detect a current flowing in the battery module or in each of the battery modules constituting the battery pack 700. The detection device may detect a cell, module, and/or ambient temperature at at least one point of the battery.

The balancing device may perform balancing operation of the battery modules and/or cells constituting the battery. The control device may receive the state information (e.g., voltage, current, temperature, etc.) of the battery modules from the detection device. The control device may monitor and calculate a state (e.g., voltage, current, temperature, state of charge (SOC), state of health (SOH), etc.) of the battery module based on the state information received from the detection device. Based on the state monitoring results, the control device may perform one or more control functions (for example, temperature control, balancing control, charge/discharge control, etc.), one or more protection functions (for example, over-discharge protection, over-charge protection, over-current protection, short circuit protection, fire extinguishing, and the like), and the like.

The control unit may perform a wired or wireless communication function with external devices of the battery pack 700 (for example, a higher-level controller or vehicle, a charger, PCS, or the like.). The control device may also control the charge/discharge operation and the protection operation of the battery.

The battery management device is a system that monitors battery states, performs diagnostics, control, communication, and protection functions, and may calculate a charge/discharge state, calculate battery life or state of health (SOH), cut off battery power as needed (relay control), control thermal management (e.g., cooling, heating, etc.), perform high-voltage interlock functions, and detect insulation and short circuit conditions.

Here, the relay control may be a function to cut off power supply from the battery in the event of a problem with a vehicle and a battery system. Each of the cathode and the anode may be provided with one or more relays and precharge relays. The high-voltage interlock function may be a function that forces the relay to open when there is an opening in the entire loop.

As described above, according to the present invention, the protection circuit arrangement has a circuit configuration with components being sequentially connected in the order of connector-fuse-overvoltage protection element to reduce inductance components of the protection circuit arrangement, thereby improving overvoltage protection performance of the protection circuit arrangement.

As used herein, the protection circuits arrangement 100, 400, 600, and 720 may be the same or substantially the same; the connector 120, 410, 510, and 610 may be the same or substantially the same; the overvoltage protection element 130, 420, 530, and 620; and the fuse 140, 520, and 630 may be the same or substantially the same.

Herein, the embodiments described herein may be implemented, for example, as a method or process, a device, a software program, a data stream, or a signal. Although discussed in the context of a single type of implementation (for example, discussed as a method), features discussed herein may also be implemented in other forms (for example, a device or a program). The device may be implemented by suitable hardware, software, firmware, and the like. The method may be implemented on a device, such as a processor that generally refers to a processing device including a computer, a microprocessor, an integrated circuit, a programmable logic device, etc. The processor includes a communication device such as a computer, a cell phone, a personal digital assistant (PDA), and other devices that facilitate communication of information between the device and end-users.

It should be understood that embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and equivalents thereof.

What is claimed is:

1. A protection circuit arrangement comprising:
a substrate having a first surface and a second surface;
a connector on the first surface and electrically connected to a battery cell;
an overvoltage protection element on the second surface and electrically connected to the connector; and
a fuse on the first surface and electrically connected to the overvoltage protection element,
wherein the substrate comprises:
 a first conductive via extending through the first surface and the second surface and connected to the connector;
 a first conductive line on the second surface and electrically connecting the first conductive via to the overvoltage protection element; and
 a ground region on the second surface, the overvoltage protection element being adjacent to and electrically connected to the ground region.

2. The protection circuit arrangement according to claim 1, wherein the substrate comprises:
a second conductive via extending through the first surface and the second surface; and
a second conductive line on the first surface and electrically connected to the second conductive via.

3. The protection circuit arrangement according to claim 2, wherein the connector is electrically connected to the first conductive via.

4. The protection circuit arrangement according to claim 2, wherein the overvoltage protection element is electrically connected to the first conductive line.

5. The protection circuit arrangement according to claim 2, wherein the fuse is electrically connected to the second conductive line.

6. The protection circuit arrangement according to claim 2, further comprising:
an analog front end integrated circuit (AFE IC) on the first surface and electrically connected to the fuse.

7. The protection circuit arrangement according to claim 1, wherein the overvoltage protection element comprises a transient voltage suppressor (TVS).

8. A battery pack comprising:
a battery cell;
an analog front end integrated circuit (AFE IC); and
a protection circuit arrangement configured to electrically connect the battery cell to the AFE IC and to protect the AFE IC from electrostatic discharge, the protection circuit arrangement comprises:
 a substrate having a first surface and a second surface;
 a connector on the first surface and electrically connected to the battery cell;
 an overvoltage protection element on the second surface and electrically connected to the connector; and
 a fuse on the first surface and electrically connected to the overvoltage protection element,
wherein the substrate comprises:
 a first conductive via extending through the first surface and the second surface and connected to the connector;
 a first conductive line on the second surface and electrically connecting the first conductive via to the overvoltage protection element; and
 a ground region on the second surface, the overvoltage protection element being adjacent to and electrically connected to the ground region.

9. The battery pack according to claim 8, wherein the substrate comprises:
a second conductive via extending through the first surface and the second surface; and
a second conductive line on the first surface and electrically connected to the second conductive via.

10. The battery pack according to claim 9, wherein the connector is electrically connected to the first conductive via.

11. The battery pack according to claim 9, wherein the overvoltage protection element is electrically connected to the first conductive line.

12. The battery pack according to claim 9, wherein the fuse is electrically connected to the second conductive line.

13. The battery pack according to claim 8, wherein the overvoltage protection element comprises a transient voltage suppressor (TVS).

* * * * *